US008798559B2

(12) United States Patent
Kilambi et al.

(10) Patent No.: US 8,798,559 B2
(45) Date of Patent: Aug. 5, 2014

(54) FIR/IIR FILTER PREDISTORTER FOR POWER AMPLIFIERS EXHIBITING SHORT-TERM AND/OR LONG-TERM MEMORY EFFECTS

(75) Inventors: Sai Mohan Kilambi, Ottawa (CA); Yuxing Zhang, Ottawa (CA); Chunlong Bai, Kanata (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 13/407,205

(22) Filed: Feb. 28, 2012

(65) Prior Publication Data
US 2013/0222059 A1     Aug. 29, 2013

(51) Int. Cl.
*H04B 1/04*     (2006.01)

(52) U.S. Cl.
USPC ............... 455/114.3; 455/114.2; 455/126; 455/67.13; 375/296; 375/297; 375/285; 330/149; 330/136

(58) Field of Classification Search
USPC ............... 455/114.2, 114.3, 126, 67.13, 67.1; 375/296, 297, 285; 330/149, 136
See application file for complete search history.

(56) References Cited

U.S. PATENT DOCUMENTS

| 7,577,211 | B2 * | 8/2009 | Braithwaite | 375/296 |
|---|---|---|---|---|
| 2005/0116775 | A1 * | 6/2005 | McBeath et al. | 330/149 |
| 2005/0157814 | A1 * | 7/2005 | Cova et al. | 375/297 |
| 2005/0195919 | A1 * | 9/2005 | Cova | 375/297 |
| 2008/0152037 | A1 * | 6/2008 | Kim et al. | 375/297 |
| 2010/0048149 | A1 | 2/2010 | Tang et al. | |

FOREIGN PATENT DOCUMENTS

EP     2244380 A1     10/2010

OTHER PUBLICATIONS

International Search Report for PCT/IB2013/050279, mailed May 17, 2013, 9 pages.
Haykin, S., Adaptive Filter Theory (book), Chapter 15, Adaptive Filters Using Infinite-Duration Impulse Response Structures, Prentice Hall, 4th Edition, Sep. 14, 2001, pp. 666-683.
Gan, L. et al., "Adaptive Predistortion of IIR Hammerstein Systems Using the Nonlinear Filtered-x LMS Algorithm," Proceedings of the Sixth International Symposium on Communication Systems, Networks, and Digital Signal Processing, IEEE, 2008, pp. 702-705, presented Jul. 23-25, 2008, Graz University of Technology, Austria.
Written Opinion for International Patent Application PCT/IB2013/050279 mailed Jan. 30, 2014, 5 pages.
International Preliminary Report on Patentability for PCT/IB2013/050279, mailed Apr. 17, 2014, 7 pages.

* cited by examiner

*Primary Examiner* — Junpeng Chen
(74) *Attorney, Agent, or Firm* — Withrow & Terranova, PLLC

(57) ABSTRACT

The present disclosure generally relates to predistortion that compensates for non-linearity of a power amplifier as well as short-term and long-term memory effects of the power amplifier. In one embodiment, a transmitter includes a power amplifier that amplifies a power amplifier input signal to provide a power amplifier output signal, a predistortion sub-system that effects predistortion of the power amplifier input signal to compensate for non-linearity of the power amplifier and memory effects of the power amplifier, and a adaptation sub-system that adaptively configures the predistortion sub-system. The predistortion sub-system includes a memory-less predistortion component that compensates for the non-linearity of the power amplifier, a Finite Impulse Response (FIR) filter that compensates for short-term memory effects of the power amplifier, and an Infinite Impulse Response (IIR) filter that compensates for long-term memory effects of the power amplifier.

24 Claims, 5 Drawing Sheets

FIR/IIR FILTER PREDISTORTER FOR POWER AMPLIFIERS EXHIBITING SHORT-TERM AND/OR LONG-TERM MEMORY EFFECTS

FIELD OF THE DISCLOSURE

The present disclosure relates to predistortion to compensate for power amplifier non-linearity and more particularly relates to predistortion to compensate for both power amplifier non-linearity and memory effects.

BACKGROUND

One major component of all wireless transmitters is a power amplifier. It is well known that power amplifiers are non-linear devices. The non-linearity of a power amplifier manifests itself in the form of inter-modulation distortion products, which lie very close to the transmitted signal in the frequency domain. These products cannot be removed by simple filtering. As such, alternative techniques, such as predistortion, have emerged to compensate for the non-linearity of power amplifiers.

Another type of distortion caused by power amplifiers, particularly when amplifying high bandwidth signals, is phase distortion resulting from memory effects of the power amplifier. Memory effects are defined as effects that occur when an output sample of the power amplifier is not only a function of a current input sample of the power amplifier but also past input samples of the power amplifier. The result of the phase distortion caused by the memory effects is generally seen as an asymmetric response in the inter-modulation products in frequency bands adjacent to the desired frequency band.

Memory effects are generally classified as short-term memory effects and long-term memory effects. Short-term memory effects are generally due to mismatches in the biasing network of the power amplifier, electro-thermal distortions, etc. These effects are generally in the order of 10 to 50 nanoseconds. Long-term memory effects on the other hand can occur due to phenomena such as charge trapping in the semiconductor lattice, which can result in slow steady state stabilization of the drain current. Typically, long-term memory effects are on the order of milliseconds or more.

There is a need for a system and method that provides power amplifier predistortion to compensate for the non-linearity of the power amplifier as well as short-term and long-term memory effects.

SUMMARY

The present disclosure generally relates to predistortion that compensates for non-linearity of a power amplifier as well as short-term and long-term memory effects of the power amplifier. In one embodiment, a transmitter includes a power amplifier that amplifies a power amplifier input signal to provide a power amplifier output signal, a predistortion sub-system that effects predistortion of the power amplifier input signal to compensate for non-linearity of the power amplifier and memory effects of the power amplifier, and an adaptation sub-system that adaptively configures the predistortion sub-system. The predistortion sub-system includes a memory-less predistortion component that compensates for the non-linearity of the power amplifier, a Finite Impulse Response (FIR) filter that compensates for short-term memory effects of the power amplifier, and an Infinite Impulse Response (IIR) filter that compensates for long-term memory effects of the power amplifier.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
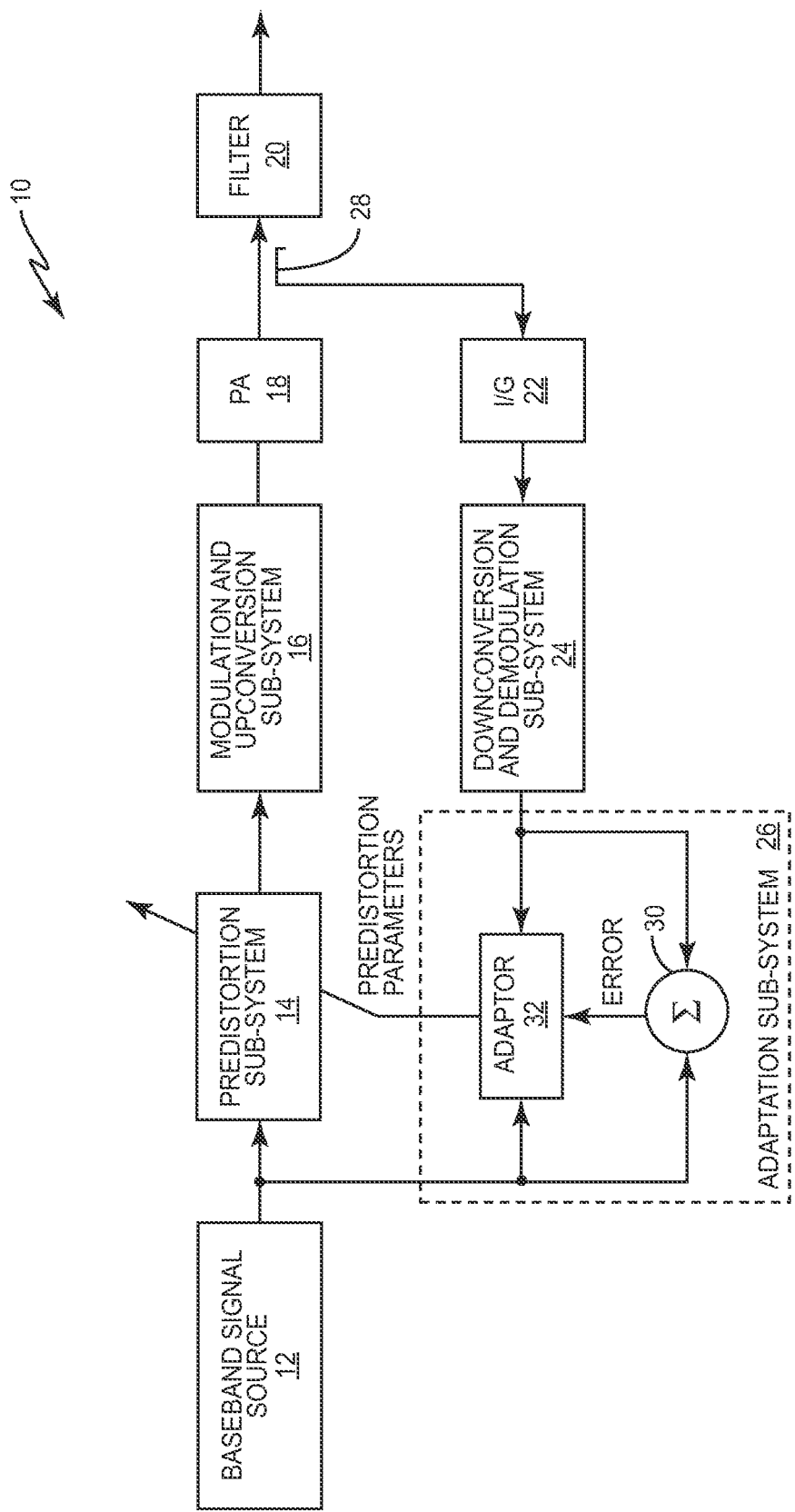
FIG. 1 illustrates a transmitter that includes a predistortion sub-system that compensates for non-linearity of a power amplifier in the transmitter as well as memory effects of the power amplifier according to one embodiment of the present disclosure.

FIG. 1 illustrates a wireless transmitter 10 that provides predistortion to compensate for both power amplifier non-linearity and memory effects according to one embodiment of the present disclosure. It should be noted that the wireless transmitter 10 is exemplary and is not intended to limit the scope of the present disclosure. Further, while the wireless transmitter 10 is a wireless transmitter, the concepts disclosed herein are also applicable to wired transmitters.

As illustrated in FIG. 1, the wireless transmitter 10 includes a transmit path that includes a baseband signal source 12, a predistortion sub-system 14, a modulation and upconversion sub-system 16, a power amplifier (PA) 18, and a filter 20 connected as shown. The baseband signal source 12 generates and outputs a baseband input signal to the predistortion sub-system 14. The predistortion sub-system 14 predistorts the baseband input signal to compensate for both non-linearity of the power amplifier 18 and long-term and short-term memory effects of the power amplifier 18 to thereby output a predistorted baseband signal. The modulation and upconversion sub-system 16 modulates and upconverts the predistorted baseband signal to provide a power amplifier input signal. The power amplifier 18 amplifies the power amplifier input signal to provide a power amplifier output signal, which is then filtered by the filter 20 to provide an output signal that is transmitted by the wireless transmitter 10.

The wireless transmitter 10 also includes a feedback path for adaptively configuring the predistortion sub-system 14. The feedback path includes an attenuator 22, a downconversion and demodulation sub-system 24, and an adaptation sub-system 26 connected as shown. The attenuator 22 receives the power amplifier output signal from the output of the power amplifier 18 via a coupler 28 and attenuates the power amplifier output signal by a factor 1/G, where G is a gain of the power amplifier 18, to provide an attenuated feedback signal. The attenuated feedback signal is then demodulated and downconverted by the downconversion and demodulation sub-system 24 to provide a baseband feedback signal. The adaptation sub-system 26 adaptively configures the predistortion sub-system 14 based on a comparison of the baseband feedback signal and the baseband input signal from the baseband signal source 12.

In this embodiment, the adaptation sub-system 26 includes a difference function 30 and an adaptor 32 configured as shown. The difference function 30 generates an error signal that is indicative of a difference between the baseband input signal and the baseband feedback signal. Based on the error signal and, in this embodiment, the baseband input signal and the baseband feedback signal, the adaptor 32 configures predistortion parameters (e.g., coefficients) of the predistortion sub-system 14 in such a manner as to minimize the error signal.

Figure 2:
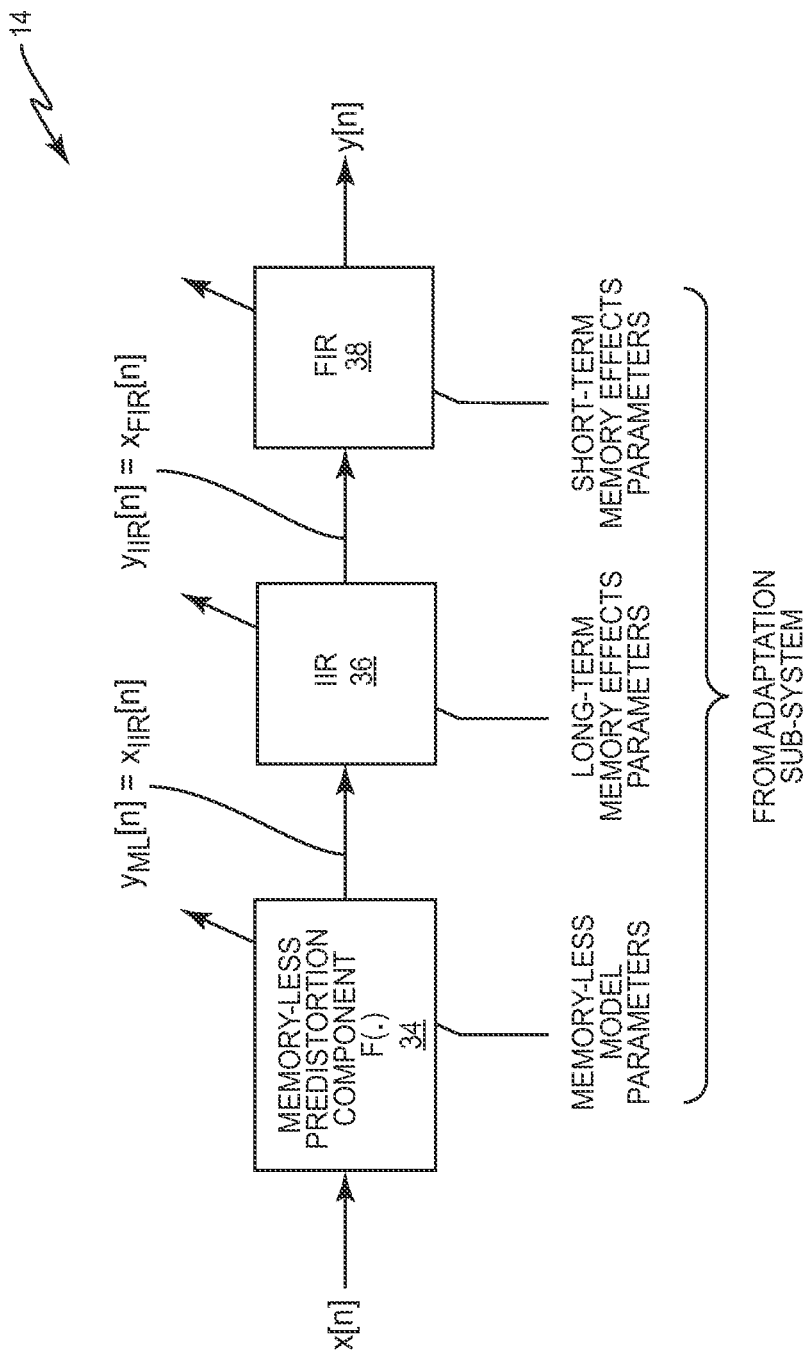
FIG. 2 is a block diagram of the predistortion sub-system of FIG. 1 wherein the predistortion sub-system includes an Infinite Impulse Response (IIR) filter that compensates for long-term memory effects and a Finite Impulse Response (FIR) filter that compensates for short-term memory effects according to one embodiment of the present disclosure.

FIG. 2 is a block diagram of the predistortion sub-system 14 of FIG. 1 according to one embodiment of the present disclosure. As illustrated, the predistortion sub-system 14 includes a memory-less predistortion component 34, an Infinite Impulse Response (IIR) filter 36, and a Finite Impulse Response (FIR) filter 38 connected in series as shown. In general, the memory-less predistortion component 34 compensates for the non-linearity of the power amplifier 18 (FIG. 1) using a memory-less model of the non-linearity of the power amplifier 18. The IIR filter 36 compensates for long-term memory effects of the power amplifier 18, whereas the FIR filter 38 compensates for short-term memory effects of the power amplifier 18. Notably, because the impulse response of the IIR filter 36 is very long relative to that of the FIR filter 38, the IIR filter 36 is not well suited to compensate for short-term memory effects. In addition, the IIR filter 36 has stability issues at high adaptation rates. Conversely, the FIR filter 38 is not well suited to compensate for long-term memory effects because the complexity of the FIR filter 38 for long-term memory effects becomes prohibitive. Rather, because the impulse response of the FIR filter 38 is very short relative to that of the IIR filter 36, the FIR filter 38 is well suited to compensate for short-term memory effects. In addition, because the FIR filter 38 does not include a feedback path, the FIR filter 38 does not suffer from stability issues at high adaptation rates. The predistortion sub-system 14 utilizes the IIR filter 36 and the FIR filter 38 such that the IIR filter 36 compensates for long-term memory effects for which it is well suited, and the FIR filter 38 compensate for short-term memory effects for which it is well suited.

More specifically, the memory-less predistortion component 34 is adaptively configured by the adaptation sub-system 26 (FIG. 1) to compensate for the non-linearity of the power amplifier 18 using a memory-less model of the non-linearity of the power amplifier 18, which is denoted as F(.). F(.) is preferably a polynomial and may be implemented as, for example, a Volterra series which includes power terms as well as cross terms between different taps or an interpolating look-up table. The memory-less model of the non-linearity of the power amplifier 18 is defined by memory-less model parameters received from the adaptation sub-system 26. The adaptation sub-system 26 may configure the memory-less model parameters and thus the memory-less predistortion component 34 using any suitable technique. Notably, there are numerous known techniques for configuring a memory-less model of the non-linearity of a power amplifier such as that implemented by the memory-less predistortion component 34. As one example, the memory-less model parameters may be adaptively configured by minimizing an error metric such as, for example, a square of an error between a baseband input signal and a baseband feedback signal.

The IIR filter 36 generally operates to compensate for long-term memory effects of the power amplifier 18. The adaptation sub-system 26 adaptively configures the IIR filter 36 to model the long-term memory effects of the power amplifier 18 via a number of long-term memory effects parameters. Preferably, the long-term memory effects parameters include coefficients that define the IIR filter 36, and the adaptation sub-system 26 calculates or otherwise determines the coefficients for the IIR filter 36 using a minimization algorithm such as, for example, least mean square or recursive least squares.

The adaptation sub-system 26 updates the long-term memory effects parameters of the IIR filter 36 at a desired adaptation rate. Again, due to the long impulse response of the IIR filter 36, the IIR filter 36 models the long-term memory effects of the power amplifier 18. Note that if there are no long-term memory effects, the adaptation sub-system 26 may configure the long-term memory effects parameters such that the IIR filter 36 is deactivated, or in other words operates in a pass-through mode of operation. Because the IIR filter 36 includes both feedforward and feedback paths, the IIR filter 36 will become unstable at high adaptation rates. Therefore, the adaptation rate of the IIR filter 36 is preferably set to a relatively low adaptation rate at which the IIR filter 36 is known to be stable. For example, a threshold adaptation rate above which the IIR filter 36 becomes unstable may be experimentally or otherwise determined. The adaptation rate for the IIR filter 36 may then be set to a rate below the threshold adaptation rate.

The FIR filter 38 generally operates to compensate for the short-term memory effects of the power amplifier 18 that are not compensated for by the IIR filter 36. The adaptation sub-system 26 adaptively configures the FIR filter 38 to model the short-term memory effects of the power amplifier 18 via a number of short-term memory effects parameters. Preferably, the short-term memory effects parameters include coefficients that define the FIR filter 38, and the adaptation sub-system 26 calculates or otherwise determines the coefficients for the FIR filter 38 using a minimization algorithm such as, for example, least mean square or recursive least squares. The adaptation sub-system 26 updates the short-term memory effects parameters at a relatively high adaptation rate that is sufficient for the FIR filter 38 to model the short-term memory effects of the power amplifier 18. In general, the adaptation rate for the FIR filter 38 is greater than the adaptation rate for the IIR filter 36. Preferably, the adaptation sub-system 26 configures the IIR filter 36 and the FIR filter 38 separately.

The memory effects that classify as "long-term" memory effects and the memory effects that classify as "short-term" memory effects will typically vary depending on the particular implementation. As one example, the long-term memory effects may be those on the order of microseconds, milliseconds, or greater whereas the short-term memory effects may be those on the order of 10 to 50 nanoseconds. Also, the exact values for the adaptation rates of the IIR filter 36 and the FIR filter 38 will vary depending on the particular implementation. However, in general, the adaptation rate for the FIR filter 38 will be greater than the adaptation rate for the IIR filter 36.

In operation, the memory-less predistortion component 34 receives the baseband input signal, which is denoted as x[n], from the baseband signal source 12. The memory-less predistortion component 34 predistorts the baseband input signal x[n] based on the memory-less model (F(.)) of the non-linearity of the power amplifier 18 to thereby output a predistorted baseband signal $y_{ML}[n]$, which is also referred to herein as an initial predistorted baseband signal. The predistorted baseband signal $y_{ML}[n]$ is provided as a baseband input signal $x_{IIR}[n]$ to the IIR filter 36. The IIR filter 36 further predistorts the baseband input signal $x_{IIR}[n]$ input to the IIR filter 36 to compensate for the long-term memory effects of the power amplifier 18 to thereby output a predistorted baseband signal $y_{IIR}[n]$, which is also referred to herein as an intermediate predistorted baseband signal. The predistorted baseband signal $y_{IIR}[n]$ is provided as a baseband input signal $x_{FIR}[n]$ to the FIR filter 38. The FIR filter 38 further predistorts the baseband input signal $x_{FIR}[n]$ input to the FIR filter 38 to compensate for the short-term memory effects of the power amplifier 18 to thereby output the predistorted baseband signal, denoted as y[n], to the modulation and upconversion sub-system 16 (FIG. 1).

Figure 3:
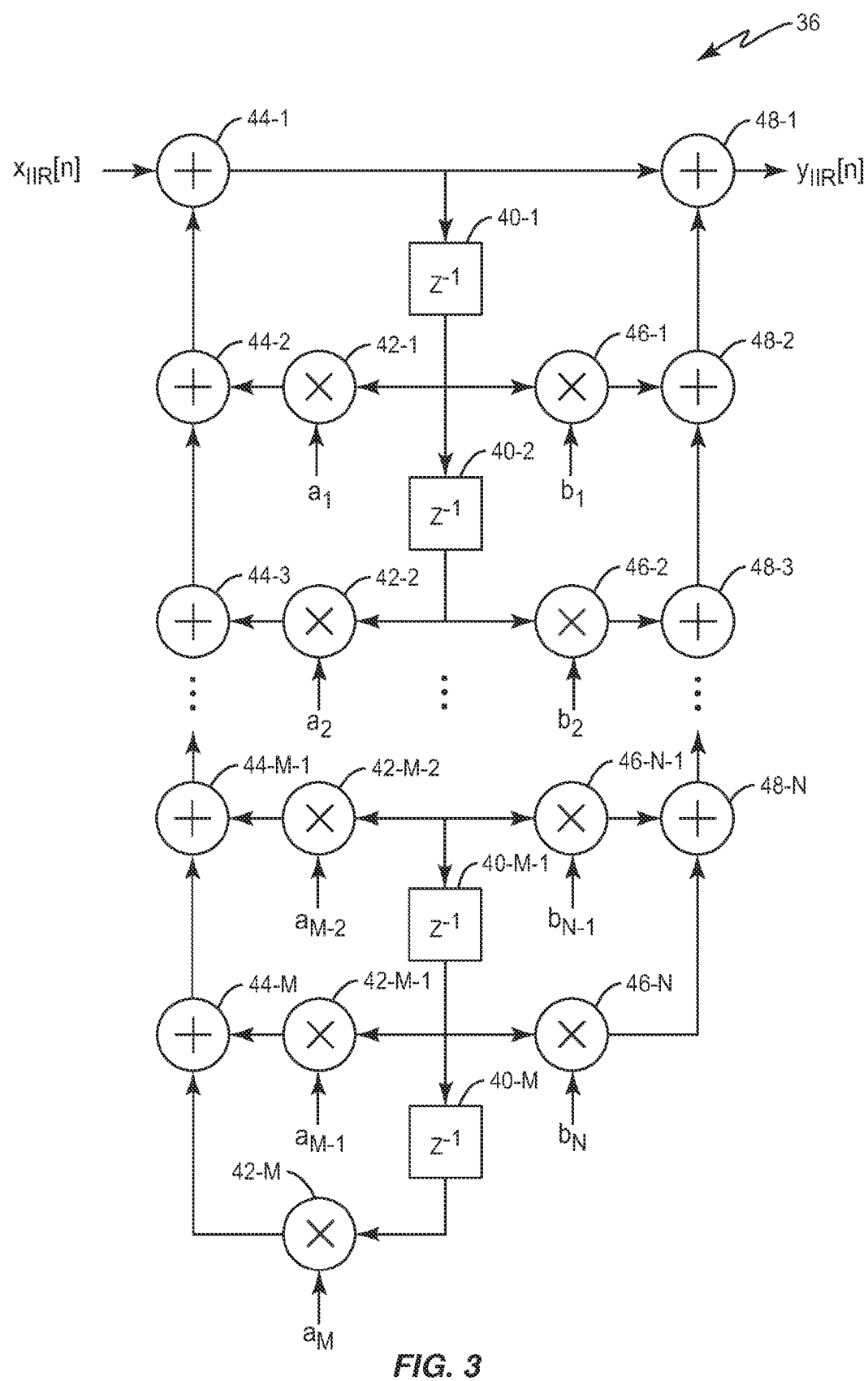
FIG. 3 illustrates one exemplary embodiment of the IIR filter of FIG. 2.

FIG. 3 is a block diagram of an exemplary embodiment of the IIR filter 36. As illustrated, the IIR filter 36 includes a number of delays, or taps, 40-1 through 40-M, multipliers 42-1 through 42-M, adders 44-1 through 44-M, multipliers 46-1 through 46-N, and adders 48-1 through 48-N connected as shown. The multipliers 42-1 through 42-M and the adders 44-1 through 44-M form corresponding feedback paths of the IIR filter 36. Similarly, the multipliers 46-1 through 46-N and the adders 48-1 through 48-N form corresponding feedforward paths of the IIR filter 36. Coefficients $a_1$ through $a_M$ and $b_1$ through $b_N$ are the long-term memory parameters adaptively configured by the predistortion sub-system 14 (FIGS. 1 and 2) to compensate for the long-term memory effects of the power amplifier 18. The IIR filter 36 implements the following mathematical representation of the IIR filter 36:

$$y_{IIR}[n] = \sum_{i=0}^{M} a_i[n]x_{IIR}[n-i] + \sum_{i=1}^{N} b_i[n]y_{IIR}[n-i],$$

where $a_0 \equiv 1$.

Figure 4:
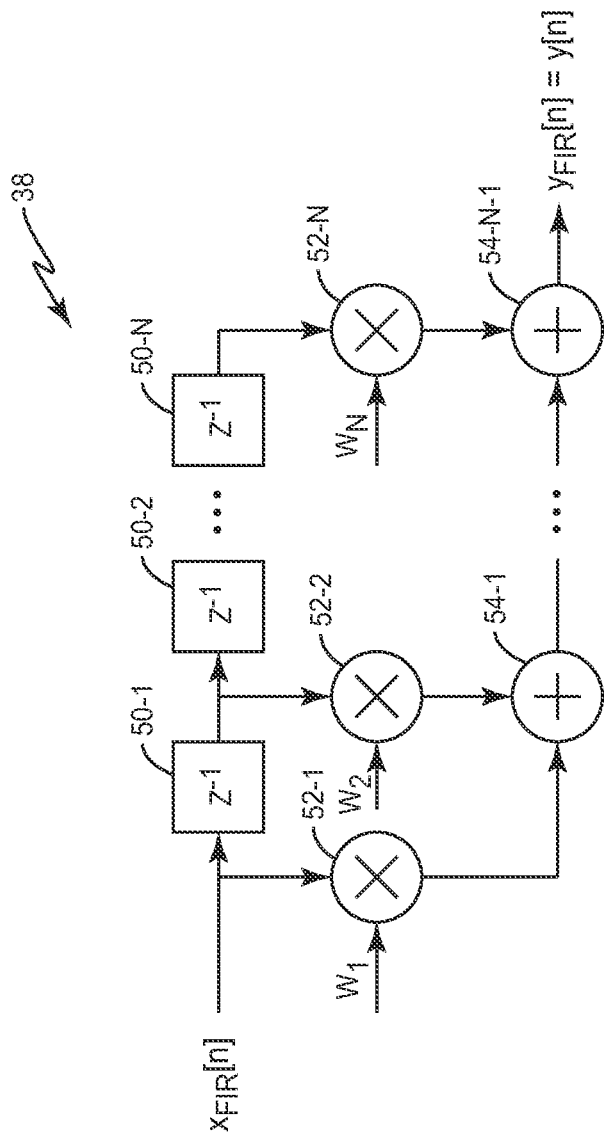
FIG. 4 illustrates one exemplary embodiment of the FIR filter of FIG. 2.

FIG. 4 is a block diagram of an exemplary embodiment of the FIR filter 38. As illustrated, the FIR filter 38 includes a number of delays, or taps, 50-1 through 50-N, multipliers 52-1 through 52-N, and adders 54-1 through 54-N−1 connected as shown. Coefficients $w_1$ through $w_N$ are the short-term memory parameters adaptively configured by the predistortion sub-system 14 (FIGS. 1 and 2) to compensate for the short-term memory effects of the power amplifier 18. The FIR filter 38 implements the following mathematical representation of the FIR filter 38:

$$y_{FIR}[n] = \sum_{i=0}^{N} w_i[n]x_{FIR}[n-i],$$

where $w_0 \equiv 1$.

Figure 5:
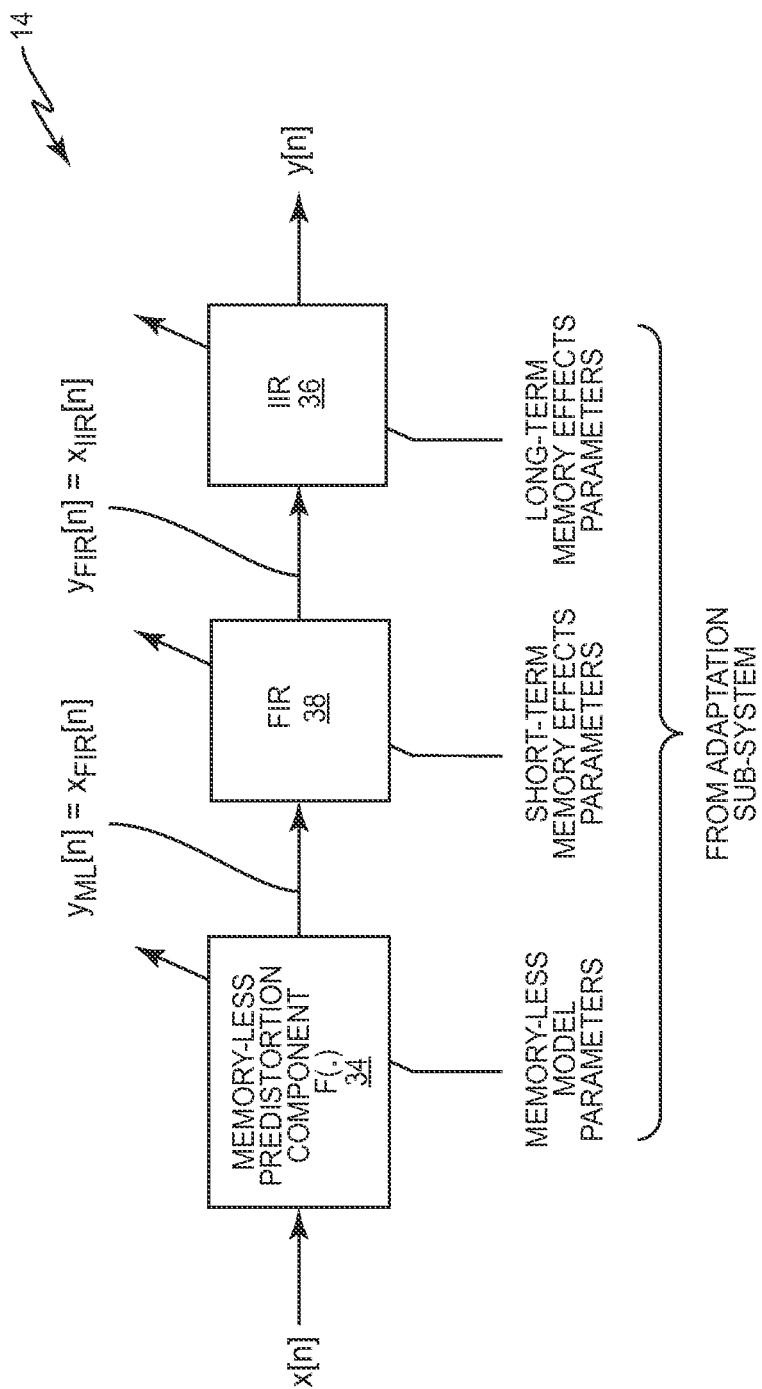
FIG. 5 is a block diagram of the predistortion sub-system of FIG. 1, wherein the predistortion sub-system includes an IIR filter that compensates for long-term memory effects and a FIR filter that compensates for short-term memory effects according to another embodiment of the present disclosure.

FIG. 5 is a block diagram of the predistortion sub-system 14 of FIG. 1 according to another embodiment of the present disclosure. The predistortion sub-system 14 of FIG. 5 is substantially the same as that of FIG. 2. However, in this embodiment, the ordering of the IIR filter 36 and the FIR filter 38 is reversed. Otherwise, the predistortion sub-system 14 is the same as that described above. It should be noted that FIG. 5 illustrates that the ordering of the IIR filter 36 and the FIR filter 38 is not critical. Also, while the memory-less predistortion component 34 is shown in both the embodiment of FIG. 2 and the embodiment of FIG. 5 as being before the IIR filter 36 and the FIR filter 38, the predistortion sub-system 14 is not limited thereto. For instance, the memory-less predistortion component 34 may alternatively follow the IIR filter 36 and the FIR filter 38.

The following acronyms are used throughout this disclosure.

| | |
| --- | --- |
| FIR | Finite Impulse Response |
| IIR | Infinite Impulse Response |
| PA | Power Amplifier |

Those skilled in the art will recognize improvements and modifications to the preferred embodiments of the present disclosure. All such improvements and modifications are considered within the scope of the concepts disclosed herein and the claims that follow.

What is claimed is:

1. A transmitter comprising:
   a power amplifier configured to amplify a power amplifier input signal to output a power amplifier output signal;
   a predistortion sub-system configured to effect predistortion of the power amplifier input signal to compensate for non-linearity of the power amplifier and memory effects, the predistortion sub-system comprising:
      a memory-less predistortion component configured to compensate for the non-linearity of the power amplifier;
      an Infinite Impulse Response filter configured to compensate for long-term memory effects; and
      a Finite Impulse Response filter configured to compensate for short-term memory effects, wherein the memory-less predistortion component, the Infinite Impulse Response filter, and the Finite Impulse Response filter are configured in series; and
   an adaptation sub-system configured to adaptively configure the predistortion sub-system.

2. The transmitter of claim 1 wherein an adaptation rate for the Infinite Impulse Response filter is different than an adaptation rate for the Finite Impulse Response filter.

3. The transmitter of claim 1 wherein an adaptation rate for the Finite Impulse Response filter is greater than an adaptation rate for the Infinite Impulse Response filter.

4. The transmitter of claim 3 wherein the adaptation rate for the Infinite Impulse Response filter is low enough that the Infinite Impulse Response filter is stable.

5. The transmitter of claim 3 wherein the short-term memory effects compensated for by the Finite Impulse Response filter are memory effects that are not compensated for by the Infinite Impulse Response filter due to an adaptation rate of the Infinite Impulse Response Filter being relatively slow and a relatively long impulse response of the Infinite Impulse Response filter.

6. The transmitter of claim 1 wherein the adaptation sub-system separately configures the Infinite Impulse Response filter and the Finite Impulse Response filter.

7. The transmitter of claim 1 wherein the long-term memory effects are memory effects in an order of at least microseconds.

8. The transmitter of claim 1 wherein the short-term memory effects are memory effects in an order of 10 to 50 nanoseconds.

9. The transmitter of claim 1 wherein the predistortion sub-system is configured to:
receive a baseband input signal; and
predistort the baseband input signal to compensate for the non-linearity of the power amplifier, the long-term memory effects, and the short-term memory effects to provide a predistorted baseband signal;
wherein the transmitter further comprises a modulation and upconversion sub-system configured to upconvert and modulate the predistorted baseband signal to provide the power amplifier input signal.

10. The transmitter of claim 1 wherein:
the memory-less predistortion component is configured to receive a baseband input signal and predistort the baseband input signal to compensate for the non-linearity of the power amplifier and thereby provide an initial predistorted baseband signal;
the Infinite Impulse Response filter is configured to predistort the initial predistorted baseband signal to compensate for the long-term memory effects and thereby provide an intermediate predistorted baseband signal; and
the Finite Impulse Response filter is configured to predistort the intermediate predistorted baseband signal to compensate for the short-term memory effects and thereby provide a final predistorted baseband signal;
wherein the transmitter further comprises a modulation and upconversion sub-system configured to upconvert and modulate the final predistorted baseband signal to provide the power amplifier input signal.

11. The transmitter of claim 1 wherein:
the memory-less predistortion component is configured to receive a baseband input signal and predistort the baseband input signal to compensate for the non-linearity of the power amplifier and thereby provide an initial predistorted baseband signal;
the Finite Impulse Response filter is configured to predistort the initial predistorted baseband signal to compensate for the short-term memory effects and thereby provide an intermediate predistorted baseband signal; and
the Infinite Impulse Response filter is configured to predistort the intermediate predistorted baseband signal to compensate for the long-term memory effects and thereby provide a final predistorted baseband signal;
wherein the transmitter further comprises a modulation and upconversion sub-system configured to upconvert and modulate the final predistorted baseband signal to provide the power amplifier input signal.

12. The transmitter of claim 1 wherein the predistortion sub-system is configured to deactivate the Infinite Impulse Response filter if there are no long-term memory effects.

13. A method of operation of a transmitter comprising:
amplifying, by a power amplifier, a power amplifier input signal to output a power amplifier output signal;
effecting predistortion of the power amplifier input signal to compensate for non-linearity of the power amplifier and memory effects via a predistortion sub-system comprising a memory-less predistortion component configured to compensate for the non-linearity of the power amplifier, an Infinite Impulse Response filter configured to compensate for long-term memory effects, and a Finite Impulse Response filter configured to compensate for short-term memory effects, wherein the memory-less predistortion component, the Infinite Impulse Response filter, and the Finite Impulse Response filter are configured in series; and
adaptively configuring the predistortion sub-system.

14. The method of claim 13 wherein adaptively configuring the predistortion sub-system comprises:
adaptively updating parameters for the Infinite Impulse Response filter at a first adaptation rate; and
adaptively updating parameters for the Finite Impulse Response filter at a second adaptation rate that is different than the first adaptation rate for the Infinite Impulse Response filter.

15. The method of claim 13 wherein adaptively configuring the predistortion sub-system comprises:
adaptively updating parameters for the Infinite Impulse Response filter at a first adaptation rate; and
adaptively updating parameters for the Finite Impulse Response filter at a second adaptation rate that is greater than the first adaptation rate for the Infinite Impulse Response filter.

16. The method of claim 15 wherein the first adaptation rate for the Infinite Impulse Response filter is low enough that the Infinite Impulse Response filter is stable.

17. The method of claim 15 wherein the short-term memory effects compensated for by the Finite Impulse Response filter are memory effects that are not compensated for by the Infinite Impulse Response filter due to the first adaptation rate of the Infinite Impulse Response filter being relatively slow and a relatively long impulse response of the Infinite Impulse Response filter.

18. The method of claim 13 wherein adaptively configuring the predistortion sub-system comprises:
adaptively updating parameters for the Infinite Impulse Response filter; and
adaptively updating parameters for the Finite Impulse Response filter separately from adaptively updating the parameters for the Infinite Impulse Response filter.

19. The method of claim 13 wherein the long-term memory effects are memory effects in an order of at least microseconds.

20. The method of claim 13 wherein the short-term memory effects are memory effects in an order of 10 to 50 nanoseconds.

21. The method of claim 13 wherein effecting predistortion of the power amplifier input signal comprises:
receiving a baseband input signal; and
predistorting the baseband input signal to compensate for the non-linearity of the power amplifier, the long-term memory effects, and the short-term memory effects to provide a predistorted baseband signal;
wherein the method further comprises upconverting and modulating the predistorted baseband signal to provide the power amplifier input signal.

22. The method of claim 13 wherein effecting predistortion of the power amplifier input signal comprises:

receiving a baseband input signal;

predistorting the baseband input signal via the memoryless predistortion component to compensate for the non-linearity of the power amplifier and thereby provide an initial predistorted baseband signal;

predistorting the initial predistorted baseband signal via the Infinite Impulse Response filter to compensate for the long-term memory effects and thereby provide an intermediate predistorted baseband signal; and predistorting the intermediate predistorted baseband signal via the Finite Impulse Response filter to compensate for the short-term memory effects and thereby provide a final predistorted baseband signal;

wherein the method further comprises upconverting and modulating the final predistorted baseband signal to provide the power amplifier input signal.

23. The method of claim 13 wherein effecting predistortion of the power amplifier input signal comprises:

receiving a baseband input signal;

predistorting the baseband input signal via the memoryless predistortion component to compensate for the non-linearity of the power amplifier and thereby provide an initial predistorted baseband signal;

predistorting the initial predistorted baseband signal via the Finite Impulse Response filter to compensate for the short-term memory effects and thereby provide an intermediate predistorted baseband signal; and predistorting the intermediate predistorted baseband signal via the Infinite Impulse Response filter to compensate for the long-term memory effects and thereby provide a final predistorted baseband signal;

wherein the method further comprises upconverting and modulating the final predistorted baseband signal to provide the power amplifier input signal.

24. The method of claim 13 further comprising deactivating the Infinite Impulse Response filter if there are no long-term memory effects.

* * * * *